United States Patent
Gaudin et al.

(10) Patent No.: US 9,548,237 B2
(45) Date of Patent: Jan. 17, 2017

(54) METHOD FOR TRANSFERRING A LAYER COMPRISING A COMPRESSIVE STRESS LAYER AND RELATED STRUCTURES

(71) Applicant: Soitec, Crolles (FR)

(72) Inventors: Gweltaz Gaudin, Grenoble (FR); Oleg Kononchuk, Grenoble (FR); Ionut Radu, Crolles (FR)

(73) Assignee: SOITEC, Bernin (FR)

( * ) Notice: Subject to any disclaimer, the term of this patent is extended or adjusted under 35 U.S.C. 154(b) by 5 days.

(21) Appl. No.: 14/377,738

(22) PCT Filed: Jan. 28, 2013

(86) PCT No.: PCT/IB2013/000128
§ 371 (c)(1),
(2) Date: Aug. 8, 2014

(87) PCT Pub. No.: WO2013/121260
PCT Pub. Date: Aug. 22, 2013

(65) Prior Publication Data
US 2015/0364364 A1    Dec. 17, 2015

(30) Foreign Application Priority Data
Feb. 16, 2012   (FR) .................................. 12 00449

(51) Int. Cl.
*B32B 7/04*      (2006.01)
*H01L 21/762*    (2006.01)
*B32B 9/04*      (2006.01)

(52) U.S. Cl.
CPC ........... *H01L 21/76254* (2013.01); *B32B 7/04* (2013.01); *B32B 9/04* (2013.01); *B32B 2457/14* (2013.01); *Y10T 428/24802* (2015.01)

(58) Field of Classification Search
CPC ........... H01L 21/76254; H01L 2924/00; H01L 21/2007; H01L 33/0079; H01L 27/1203
(Continued)

(56) References Cited

U.S. PATENT DOCUMENTS 6,284,631 B1    9/2001   Henley et al.
7,405,136 B2 *  7/2008   Delprat ............. H01L 21/76254
                                                    257/E21.568

(Continued)

FOREIGN PATENT DOCUMENTS

EP      986826 B1    12/2010
EP     1208589 B1    12/2010
EP     1208593 B1     2/2011

OTHER PUBLICATIONS

Bo Cui, NE 343: Microfabrication and thin film technology (Chapter 8 Ion Implantation), Jan. 4, 2011.*

(Continued)

*Primary Examiner* — Marc Armand
*Assistant Examiner* — Shannon Yi
(74) *Attorney, Agent, or Firm* — TraskBritt

(57) ABSTRACT

A method comprising the following steps: providing a support substrate and a donor substrate, forming an embrittlement region in the donor substrate so as to delimit a first portion and a second portion on either side of the embrittlement region, assembling the donor substrate on the support substrate, fracturing the donor substrate along the embrittlement region. In addition, the method comprises a step consisting of forming a compressive stress layer in the donor substrate so as to delimit a so-called confinement region interposed between the compressive stress layer and the embrittlement region.

17 Claims, 2 Drawing Sheets

(58) Field of Classification Search
USPC .......................... 438/458, 715; 257/E21.568
See application file for complete search history.

(56) References Cited

U.S. PATENT DOCUMENTS

| | | | |
|---|---|---|---|
| 7,531,430 | B2 | 5/2009 | Kononchuk |
| 7,615,466 | B2 | 11/2009 | Kononchuk |
| 7,736,994 | B2 | 6/2010 | Reynaud et al. |
| 8,202,785 | B2 | 6/2012 | Castex et al. |
| 8,263,475 | B2 | 9/2012 | Radu et al. |
| 8,273,636 | B2 | 9/2012 | Neyret et al. |
| 8,324,072 | B2 | 12/2012 | Veytizou et al. |
| 8,461,017 | B2 | 6/2013 | Sadaka et al. |
| 8,475,612 | B2 | 7/2013 | Gaudin |
| 8,481,406 | B2 | 7/2013 | Sadaka et al. |
| 8,501,537 | B2 | 8/2013 | Sadaka et al. |
| 8,575,002 | B2 | 11/2013 | Broekaart et al. |
| 8,603,896 | B2 | 12/2013 | Gaudin et al. |
| 8,623,740 | B2 | 1/2014 | Landru et al. |
| 8,673,733 | B2 | 3/2014 | Sadaka et al. |
| 8,716,105 | B2 | 5/2014 | Sadaka et al. |
| 8,759,881 | B2 | 6/2014 | Bethoux et al. |
| 8,765,571 | B2 | 7/2014 | Kononchuk et al. |
| 2004/0031979 | A1 | 2/2004 | Lochtefeld et al. |
| 2004/0053477 | A1* | 3/2004 | Ghyselen .......... H01L 21/76254 438/465 |
| 2004/0173790 | A1* | 9/2004 | Yeo .................. H01L 21/76254 257/19 |
| 2006/0073674 | A1* | 4/2006 | Fitzgerald ............... C30B 25/20 438/458 |
| 2008/0145650 | A1 | 6/2008 | Radu et al. |
| 2008/0153257 | A1 | 6/2008 | Kononchuk |
| 2008/0153313 | A1 | 6/2008 | Kononchuk |
| 2008/0176380 | A1 | 7/2008 | Reynaud et al. |
| 2008/0268621 | A1 | 10/2008 | Reynaud et al. |
| 2010/0052092 | A1 | 3/2010 | Capello et al. |
| 2010/0264458 | A1 | 10/2010 | Radu et al. |
| 2011/0127581 | A1 | 6/2011 | Bethoux et al. |
| 2011/0193201 | A1 | 8/2011 | Kononchuk et al. |
| 2012/0013012 | A1 | 1/2012 | Sadaka et al. |
| 2012/0013013 | A1 | 1/2012 | Sadaka et al. |
| 2012/0241821 | A1 | 9/2012 | Bethoux et al. |
| 2012/0252162 | A1 | 10/2012 | Sadaka et al. |
| 2012/0252189 | A1 | 10/2012 | Sadaka et al. |
| 2013/0075868 | A1 | 3/2013 | Sadaka et al. |
| 2013/0175672 | A1 | 7/2013 | Sadaka et al. |
| 2013/0217206 | A1 | 8/2013 | Sadaka et al. |
| 2013/0256907 | A1 | 10/2013 | Sadaka et al. |
| 2013/0299997 | A1 | 11/2013 | Sadaka et al. |

OTHER PUBLICATIONS

International Written Opinion for International Application No. PCT/IB2013/000128 dated Aug. 16, 2014, 4 pages.
International Preliminary Report on Patentability for International Application No. PCT/IB2013/000128 dated Aug. 19, 2014, 5 pages.
International Search Report for International Application No. PCT/IB2013/000128 dated Mar. 22, 2013, 3 pages.

* cited by examiner

METHOD FOR TRANSFERRING A LAYER COMPRISING A COMPRESSIVE STRESS LAYER AND RELATED STRUCTURES

CROSS-REFERENCE TO RELATED APPLICATIONS

This application is a national phase entry under 35 U.S.C. §371 of International Patent Application PCT/IB2013/000128, filed Jan. 28, 2013, designating the United States of America and published in English as International Patent Publication WO 2013/121260 A1 on Aug. 22, 2013, which claims the benefit under Article 8 of the Patent Cooperation Treaty and under 35 U.S.C. §119(e) to French Patent Application Serial No. 1200449, filed Feb. 16, 2012, the disclosure of each of which is hereby incorporated herein in its entirety by this reference.

TECHNICAL FIELD

The present invention relates to a method for transferring a layer, and to a structure.

BACKGROUND

A method for transferring a layer known from the prior art, called SMART CUT®, comprises the following steps:
a) providing a support substrate,
b) providing a donor substrate,
c) forming an embrittlement region in the donor substrate so as to delimit a first portion and a second portion of the donor substrate on either side of the embrittlement region, the first portion of the donor substrate being intended to be added onto the support substrate, the second portion of the donor substrate being able to be recycled,
d) assembling the donor substrate on the support substrate,
e) fracturing the donor substrate along the embrittlement region, preferably by a heat treatment.

After step e), the first portion of the donor substrate forms the layer transferred onto the support substrate, and is commonly called an "active layer."

It is found from trial and error that the free surface of the active layer exhibits a high roughness, typically between 50 and 70 Å RMS, typically 60 Å RMS, which is mainly due to the propagation of the fracture front along the embrittlement region.

This surface roughness may require a significant number of steps for treating the free surface of the active layer in order to reduce its roughness so as to obtain a value of typically between a few Å RMS and 30 Å RMS. These treatment steps may, in particular, comprise anneal, oxidation and polishing steps. These treatment steps are notably detailed in the documents EP 0 986 826, EP 1 208 589 and EP 1 208 593.

A method known from the prior art, notably from U.S. Pat. No. 6,284,631, proposes forming a stress layer in the donor substrate, and forming the embrittlement region inside the stress layer so as to facilitate the fracture along the embrittlement region. According to this document, this prior art method would facilitate the propagation of the fracture front by reducing the energy level required for the fracture in the stress layer, by compression or by tension.

Even though such a prior art method would make it possible to reduce the fracture energy level and control the initiation of the propagation of the fracture front, this method does not make it possible to control the spatial dispersion of the propagation of the fracture front and, therefore, to significantly reduce the surface roughness of the active layer. To this end, U.S. Pat. No. 6,284,631 proposes limiting the energy or the stresses in the donor substrate in order to reduce the possibility of uncontrolled initiations of fracture fronts and reduce the surface roughness.

Consequently, such a prior art method is complex to implement since it is necessary to determine an energy for the stress layer that is sufficiently high to reduce the energy of the fracture and sufficiently low to reduce the possibility of uncontrolled initiations of fracture fronts and reduce the surface roughness.

Moreover, such a prior art method requires excellent control of the depth and of the thicknesses of the stress layer and of the embrittlement region in as much as the embrittlement region must, without fail, be formed inside the stress layer.

DISCLOSURE

The present invention aims to remedy the abovementioned drawbacks, and relates to a method for transferring a layer comprising the following steps:
a) providing a support substrate,
b) providing a donor substrate,
c) forming an embrittlement region in the donor substrate so as to delimit a first portion and a second portion of the donor substrate on either side of the embrittlement region, the first portion of the donor substrate being intended to be added to the support substrate,
d) assembling the donor substrate on the support substrate,
e) fracturing the donor substrate along the embrittlement region,
the transfer method being noteworthy in that it comprises a step c1) consisting of forming a compressive stress layer in the donor substrate so as to delimit a so-called "confinement region" interposed between the compressive stress layer and the embrittlement region.

Thus, the formation of such a compressive stress layer makes it possible to block the propagation of the fracture front, and thereby contain this propagation of the fracture front along the embrittlement region in the confinement region. The applicant has found, through trial and error, that it is essential for the layer to be stressed by compression and not by tension to obtain this confinement. In practice, by contrast, a tensile stress layer would favor the propagation of the fracture front.

The free surface of the confinement region after step e) then exhibits a surface roughness typically between a few Å RMS and 30 Å RMS.

Furthermore, such a transfer method according to the invention does not necessitate determining a precise energy for the compressive stress layer in as much as uncontrolled initiations of any fracture fronts will not influence the surface roughness since these fracture fronts will remain confined within the confinement region.

Furthermore, such a transfer method according to the invention allows for a tolerance with respect to a perfect control of the depth and of the thickness of the compressive stress layer and of the embrittlement region in as much as the compressive stress layer is situated at a distance from the embrittlement region, this tolerance affecting only the thickness of the confinement region.

According to one implementation, the compressive stress layer is formed during step c1) in the first portion of the donor substrate so as to delimit the confinement region and a so-called "active region" on either side of the compressive stress layer, the active region forming the layer transferred after step e).

Thus, such a compressive stress layer, interposed between the active region and the embrittlement region, makes it possible to effectively protect the active layer from the effects of the fracture front, for example, the formation of crystalline defects, breaks, cracks, etc.

According to one implementation, the transfer method comprises step c2) consisting of forming an additional compressive stress layer in the donor substrate so as to delimit an additional confinement region interposed between the additional compressive stress layer and the embrittlement region, the confinement region and the additional confinement region being arranged on either side of the embrittlement region.

Thus, such compressive stress layers form a guide for the propagation of the fracture front. This propagation of the fracture front is confined in the confinement regions on either side of the embrittlement region.

Advantageously, the compressive stress layer is formed during step c1) in the first portion of the donor substrate, and the transfer method comprises step e1) consisting of, after step e), eliminating the additional confinement region and the additional compressive stress layer.

Thus, such a step e1) makes it possible to envisage recycling the second portion of the donor substrate.

According to one embodiment, step e1) is performed by a selective etching of the additional confinement region and of the additional compressive stress layer, or is performed by an oxidation followed by an etching of the additional confinement region and of the additional compressive stress layer.

According to one implementation, the compressive stress layer is formed during step c1) in the first portion of the donor substrate, and the transfer method comprises step consisting of, after step e), eliminating the confinement region and the compressive stress layer.

Thus, such a step f) makes it possible to finalize the transfer of the active region, which then has a free surface.

Advantageously, step f) comprises a rapid annealing step suitable for treating the free surface of the first portion of the donor substrate.

This rapid annealing step is conventionally carried out at a temperature between 900° C. and 1300° C., for a duration not exceeding 15 minutes, and in a non-oxidizing atmosphere.

Thus, the obtaining and treatment of the transferred layer during step f) obtained by treatment techniques (etching, oxidation, rapid bake) are performed with a significant time saving, in as much as the free surface of the confinement region after step e) exhibits a surface roughness of typically between a few Å RMS and 30 Å RMS.

According to one implementation, the donor substrate is produced in a material, and step c1) and/or step c2) are performed by the implantation of species exhibiting an atomic radius greater than the atomic radius of the atoms of the material.

Thus, the choice of such an atomic radius for the ionized atoms allows for the formation of a compressive stress layer.

Advantageously, the parameters of the implantation of species, such as the energy and the dose, are suitable for rendering the region of the donor substrate subjected to the implantation amorphous. Thus, such an implantation makes it possible to form the compressive stress layer or layers juxtaposed with the region of the donor substrate rendered amorphous.

Thus, the interface between the region rendered amorphous of the donor substrate and the corresponding compression layer is perfectly delimited, which makes it possible to improve the quality of the layer. It should be noted that the deposition of an amorphous layer, followed by an implantation of species beyond this amorphous layer, does not make it possible to obtain the abovementioned technical effect.

Advantageously, the parameters of the implantation are suitable for rendering substantially all of the regions of the substrate subjected to the implantation amorphous.

Thus, the risk of the formation of defects is considerably reduced.

The methods for reconstructing the region of the donor substrate subjected to the implantation, and rendered amorphous, are known to the person skilled in the art, for example, a thermal annealing at 475° C.

According to a variant implementation, the donor substrate is produced in a material, and the compressive stress layer or layers are formed by epitaxial growth steps, the compressive stress layer or layers comprising atoms exhibiting an atomic radius greater than the atomic radius of the atoms of the material.

According to one embodiment, step f) is performed by a selective etching of the confinement region and of the compressive stress layer.

Thus, such an embodiment is particularly effective when the stress layer has been formed by epitaxy in as much as the interface between the confinement region and the stress layer is generally well demarcated.

Preferentially, the embrittlement region is formed during step c) by the implantation of species, such as hydrogen and/or helium.

According to one embodiment, the donor substrate is produced in a semiconductive material, preferentially silicon, the semiconductive material preferentially being monocrystalline.

According to one implementation, the transfer method comprises a step, prior to step d), consisting of forming a dielectric layer on the first portion of the donor substrate and/or on the support substrate.

Thus, such a transfer method makes it possible to obtain a structure of the semiconductor-on-insulator type.

According to one feature, the material in which the donor substrate is produced is selected from the group comprising silicon (Si), germanium (Ge), silicon-germanium (SiGe), the III-V material such as gallium nitride (GaN), gallium arsenide (GaAs), or indium phosphide (InP).

The present invention also relates to a structure comprising:
  a support substrate,
  a donor substrate arranged on the support substrate,
  an embrittlement region formed in the donor substrate so as to delimit a first portion and a second portion of the donor substrate on either side of the embrittlement region, the first portion of the donor substrate being oriented toward the support substrate, the structure being noteworthy in that it comprises a compressive stress layer formed in the first portion of the donor substrate so as to delimit a so-called confinement region and a so-called active region on either side of the compressive stress layer, the confinement region being interposed between the compressive stress layer and the embrittlement region, the active region being intended to be transferred to the support substrate.

Thus, such a compressive stress layer makes it possible to block the propagation of the fracture front, and thereby contain this propagation of the fracture front along the embrittlement region in the confinement region. The free surface of the confinement region after fracture then exhibits a surface roughness typically between a few Å RMS and 30 Å RMS. This low surface roughness obtained makes it possible to facilitate the transfer of the active region onto the support substrate.

Furthermore, such a structure according to the invention does not necessitate determining a precise energy for the compressive stress layer in as much as uncontrolled initiation of any fracture fronts will not affect the surface roughness since these fracture fronts will remain confined within the confinement region.

Furthermore, such a structure according to the invention allows for a tolerance with respect to a perfect control of the depth and of the thickness of the compressive stress layer and of the embrittlement region in as much as the compressive stress layer is situated at a distance from the embrittlement region, this tolerance affecting only the thickness of the confinement region.

Moreover, such a compressive stress layer, interposed between the active region and the embrittlement region, makes it possible to effectively protect the active layer from the effects of the fracture front, for example, the formation of crystalline defects, brakes, cracks, etc.

In one embodiment, the structure comprises an additional compressive stress layer formed in the second portion of the donor substrate so as to delimit an additional confinement region interposed between the additional compressive stress layer and the embrittlement region.

Thus, such compressive stress layers form a guide for the propagation of the fracture front. This propagation of the fracture front is confined to the confinement regions on either side of the embrittlement region.

According to one embodiment, the donor substrate is produced in a material comprising a set of atoms exhibiting a predetermined atomic radius, each compressive stress layer comprising a set of atoms exhibiting an atomic radius greater than the predetermined atomic radius.

Thus, the choice of such an atomic radius allows for the formation of a compressive stress layer.

According to one embodiment, the compressive stress layer or layers have a thickness and a depth suitable for confining the propagation of a fracture front along the embrittlement region in the confinement region or regions.

The thickness of the compressive stress layer or layers is designed so that each compressive stress layer has at least a few atomic layers in order to block the propagation of the fracture front. Furthermore, each compressive stress layer has to have a thickness less than a critical thickness from which the latter can be relaxed.

The depth of the compressive stress layers is designed so that the total thickness of the confinement regions has a value of between 10 Å and 30 Å, preferably between 10 Å and 100 Å.

In the embodiments with a single compressive stress layer, the depth of the compressive stress layer is designed so that the thickness of the confinement region has a value of between 10 Å and 150 Å, preferably between 10 Å and 50 Å.

Thus, the thickness of the compressive stress layer or layers is designed to ensure the function of blocking the propagation of the fracture front. The depth of the compressive stress layer or layers defines the thickness of the confinement region or regions, the depth being designed to obtain a surface roughness of between a few Å RMS and 30 Å RMS.

According to a preferential characteristic of the invention, the material in which the donor substrate is produced is selected from the group comprising silicon (Si), germanium (Ge), silicon-germanium (SiGe), the III-V materials such as gallium nitride (GaN), gallium arsenide (GaAs), or indium phosphide (InP).

In one embodiment, the structure comprises a dielectric layer interposed between the support substrate and the donor substrate.

BRIEF DESCRIPTION OF THE DRAWINGS

Other features and advantages will become apparent from the following description of two implementations of a transfer method according to the invention, given as non-limiting examples, with reference to the accompanying drawings in which.

DETAILED DESCRIPTION

For the different implementations, the same references will be used for identical elements or elements that handle the same function, in the interest of simplifying the description.

Figure 1:
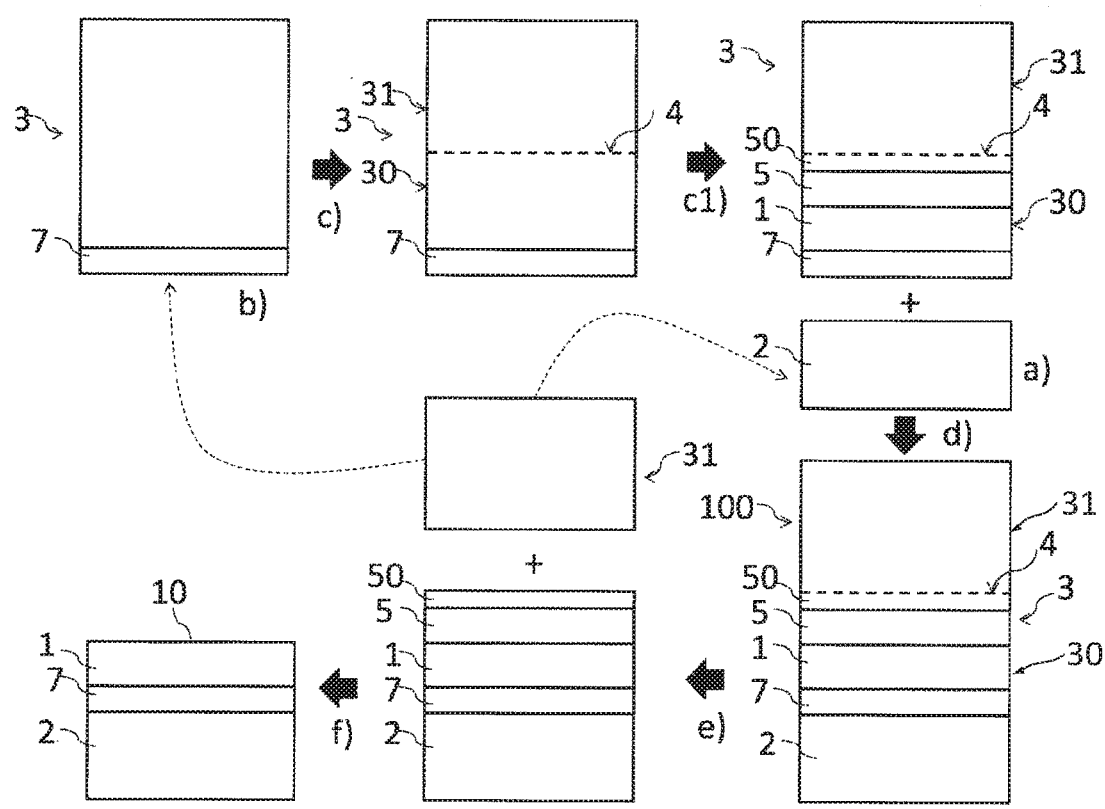
FIG. 1 is a schematic view illustrating the steps for the first implementation of the method according to the invention, and a first embodiment of a structure according to the invention.

The transfer method illustrated in FIG. 1 is a method for transferring a layer 1 comprising the following steps:
a) providing a support substrate 2,
b) providing a donor substrate 3,
c) forming an embrittlement region 4 in the donor substrate 3 so as to delimit a first portion 30 and a second portion 31 of the donor substrate 3 on either side of the embrittlement region 4, the first portion 30 of the donor substrate 3 being intended to be added onto the support substrate 2,
  c1) forming a compressive stress layer 5 in the first portion 30 of the donor substrate 3 so as to delimit a so-called confinement region 50 and the so-called active region 1 on either side of the compressive stress layer 5, the confinement region 50 being interposed between the compressive stress layer 5 and the embrittlement region 4,
d) assembling the donor substrate 3 on the support substrate 2,
e) fracturing the donor substrate 3 along the embrittlement region 4, preferably by a heat treatment.

The active region 1 forms the layer transferred onto the support substrate 2 after step e).

The support substrate 2 provided in step a) can be produced in any type of material, preferably of semiconductive type, for example, silicon. The support substrate 2 can have simply a stiffness function relative to the active region 1 to be transferred. The support substrate 2 can also have suitable electrical and/or thermal properties according to the desired application. The support substrate 2 may also comprise electronic devices, interconnections and/or metallized regions formed before the transfer of the active region 1.

The donor substrate 3 provided in step b) can be produced in any type of material, preferably of semiconductive type, also preferentially of monocrystalline type. The donor substrate 3 may also be of composite type, that is to say, formed by a plurality of layers of different materials, one of which forms the active region 1.

As can be seen in FIG. 1, the method may comprise a step, prior to step d), consisting of forming a dielectric layer 7 on the first portion 30 of the donor substrate 3. In the case where the donor substrate 3 is produced in silicon, the dielectric layer 7 is preferentially of silicon dioxide. The formation of the dielectric layer 7 can also be performed on the support substrate 2 by replacing or complementing the dielectric layer 7 formed on the donor substrate 3.

The embrittlement region 4 is formed during step c) by the implantation of species, such as hydrogen and/or helium. The implantation can be performed with a single species such as hydrogen, but also with a plurality of species implanted sequentially such as hydrogen and helium. The parameters of the implantation, essentially the dose and the energy, are determined according to the nature of the species and of the donor substrate 3.

According to one implementation, the step c1) is performed by the implantation of species exhibiting an atomic radius greater than the atomic radius of the atoms of the material in which the donor substrate 3 is produced.

The parameters of the implantation of species, essentially the energy and the dose, can be adapted to render the region of the donor substrate 3 that is subjected to the implantation amorphous.

According to a variant implementation, the compressive stress layer 5 is formed by an epitaxial growth step, the compressive stress layer 5 comprising atoms exhibiting an atomic radius greater than the atomic radius of the atoms of the material in which the donor substrate is produced. More specifically, the compressive stress layer 5 is formed by an epitaxial growth step on the free surface of the portion of donor substrates 3 consisting of the second portion 31 of the donor substrate 3 and the confinement region 50. Then, the active region 1 can also be formed by an epitaxial growth step.

It should be noted that the steps c) and c1) can be reversed.

Step d) can be performed by a bonding of molecular adhesion type. Step d) can be preceded by any treatment of the support substrate 2 and of the donor substrate 3 that aims to reinforce the bonding energy, such as plasma cleaning or activation.

As soon as step e) is executed, the second portion 31 of the donor substrate 3 can be recycled (symbolized by the dotted line arrows).

As a nonlimiting example, step e) can be performed by a heat treatment with a temperature ramp of between 200° C. and 600° C., and a temperature increase of between 1° C. and 10° C. per minute.

The transfer method comprises a step f) consisting of, after step e), eliminating the confinement region 50 and the compressive stress layer 5. Step f) may comprise a step of selective etching of the confinement region 50 and of the compressive stress layer 5. The result of this is that the active region 1 has a free surface 10. Step f) can comprise a rapid annealing step suitable for treating the free surface 10 of the active region 1.

Figure 2:
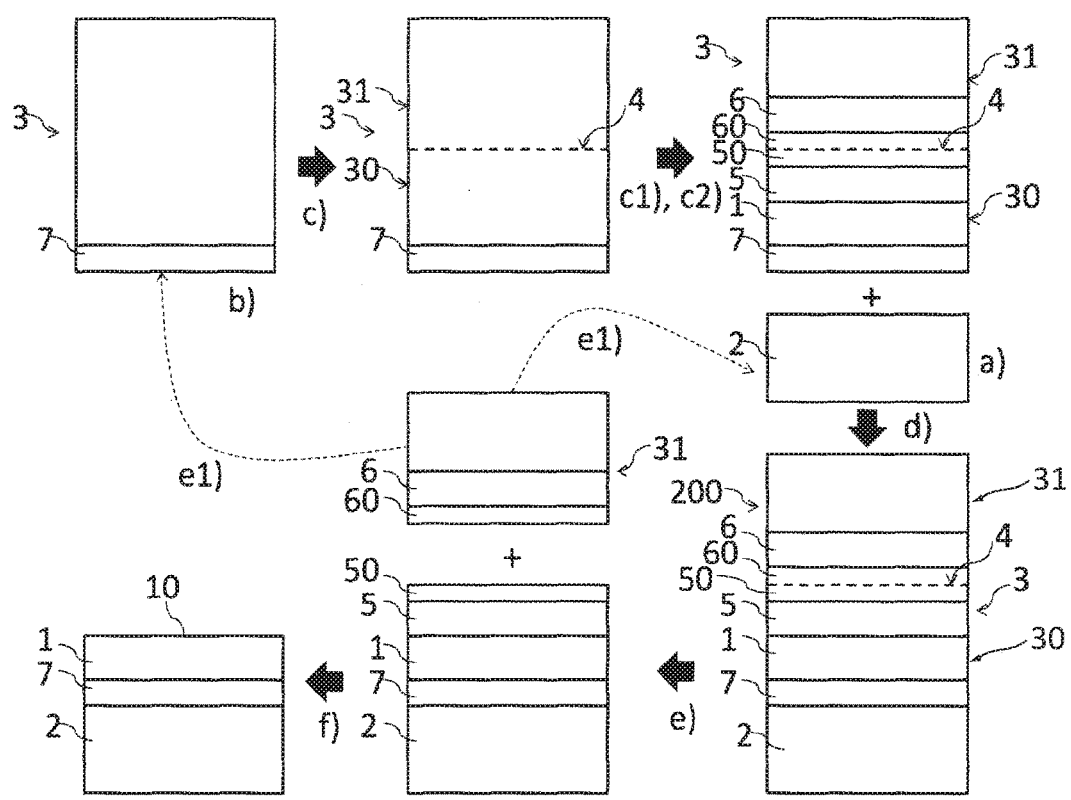
FIG. 2 is a schematic view illustrating the steps for the second implementation of the method according to the invention, and a second embodiment of a structure according to the invention.

The transfer method illustrated in FIG. 2 differs from the transfer method illustrated in FIG. 1 in that it comprises a step c2) consisting of forming an additional compressive stress layer 6 in the second portion 31 of the donor substrate 3 so as to delimit an additional confinement region 60 interposed between the additional compressive stress layer 6 and the embrittlement region 4.

The transfer method comprises a step e1) consisting of, after step e), eliminating the additional confinement region 60 and the additional compressive stress layer 6. Step e1) can be performed by a selective etching of the additional confinement region 60 and of the additional compressive stress layer 6, or can be performed by an oxidation followed by an etching of the additional confinement region 60 and of the additional compressive stress layer 6.

According to one implementation, step c2) is performed by the implantation of species exhibiting an atomic radius greater than the atomic radius of the atoms of the material in which the donor substrate 3 is produced.

According to a variant implementation, the additional compressive stress layer 6 is formed by an epitaxial growth step, the additional compressive stress layer 6 comprising atoms exhibiting an atomic radius greater than the atomic radius of the atoms of the material in which the donor substrate 3 is produced. According to this variant implementation, the additional compressive stress layer 6, the additional confinement region 60, the confinement region 50, the compressive stress layer 5, and the active region 1 are formed successively, by epitaxial growth, on the donor substrate 3.

According to one implementation that is not illustrated, the transfer method differs from the method illustrated in FIG. 2 in that step c1) comprises forming the compressive stress layer 5 in the second portion 31 of the donor substrate 3 so as to delimit the confinement region 50 interposed between the compressive stress layer 5 and the embrittlement region 4.

Obviously, the implementations of the invention described above are in no way limiting. Details and enhancements can be made to them in other variant embodiments without in any way departing from the framework of the invention.

The present invention relates also to a structure.

For the different embodiments, the same references will be used for identical elements or elements that handle the same function, in the interest of simplifying the description.

The structure 100 illustrated in FIG. 1 corresponds to the structure obtained after step d) of the transfer method.

The structure 100 comprises:
 a support substrate 2,
 a donor substrate 3 arranged on the support substrate 2,
 an embrittlement region 4 formed in the donor substrate 3 so as to delimit a first portion 30 and a second portion 31 of the donor substrate 3 on either side of the embrittlement region 4, the first portion 30 of the donor substrate 3 being oriented toward the support substrate 2.

The structure 100 comprises a compressive stress layer 5 formed in the first portion 30 of the donor substrate 3 so as to delimit a so-called confinement region 50 and a so-called active region 1 on either side of the compressive stress layer 5, the confinement region 50 being interposed between the compressive stress layer 5 and the embrittlement region 4, the active region 1 being intended to be transferred onto the support substrate 2.

The donor substrate 3 is produced in a material comprising a set of atoms exhibiting a predetermined atomic radius, and the compressive stress layer 5 comprises a set of atoms exhibiting an atomic radius greater than the predetermined atomic radius.

The compressive stress layer 5 has a thickness and a depth suitable for confining the propagation of a fracture front along the embrittlement region 4 in the confinement region 50.

The structure 200 illustrated in FIG. 2 differs from the structure 100 illustrated in FIG. 1 in that it comprises an additional compressive stress layer 6 formed in the second portion 31 of the donor substrate 3 so as to delimit an additional confinement region 60 interposed between the additional compressive stress layer 6 and the embrittlement region 4.

Obviously, the embodiments of the invention described above are in no way limited. Details and enhancements can be made thereto in other variants of execution without in any way departing from the framework of the invention.

The invention claimed is:

1. A method for transferring a layer, comprising:
providing a support substrate;
providing a donor substrate;
forming an embrittlement region in the donor substrate and delimiting a first portion and a second portion of the donor substrate on either side of the embrittlement region;
forming a compressive stress layer in the donor substrate and delimiting a confinement region interposed between the compressive stress layer and the embrittlement region;
assembling the donor substrate on the support substrate such that the first portion of the donor substrate is between the support substrate and the second portion of the donor substrate; and
fracturing the donor substrate along the embrittlement region and transferring a layer from the donor substrate to the support substrate; and
wherein forming the compressive stress layer in the donor substrate comprises forming the compressive stress layer in the first portion of the donor substrate and delimiting the confinement region and an active region on either side of the compressive stress layer, the active region forming the layer transferred from the donor substrate to the support substrate.

2. The method of claim 1, further comprising forming an additional compressive stress layer in the donor substrate and delimiting an additional confinement region interposed between the additional compressive stress layer and the embrittlement region, the confinement region and the additional confinement region being located on opposing sides of the embrittlement region.

3. The method of claim 1, further comprising removing the confinement region and the compressive stress layer after fracturing the donor substrate along the embrittlement region.

4. The method of claim 1, further comprising performing a rapid annealing process for treating a free surface of the first portion of the donor substrate.

5. The method of claim 1, wherein forming an embrittlement region in the donor substrate comprises implanting ions into the donor substrate, the ions having an atomic radius greater than an atomic radius of atoms of a material of the donor substrate.

6. The method of claim 1, wherein forming a compressive stress layer in the donor substrate comprises epitaxially growing the compressive stress layer on the donor substrate, the compressive stress layer comprising atoms having an atomic radius greater than an atomic radius of atoms of a material of the donor substrate.

7. The method of claim 1, further comprising selectively etching the confinement region and the compressive stress layer to remove the confinement region and the compressive stress layer from the support substrate after transferring the layer from the donor substrate to the support substrate.

8. The method of claim 2, further comprising removing the additional confinement region and the additional compressive stress layer after fracturing the donor substrate along the embrittlement region.

9. The method of claim 5, wherein implanting the ions into the donor substrate comprises forming an amorphous region in the donor substrate.

10. The method of claim 7, further comprising forming a dielectric layer on at least one of the donor substrate and the support substrate prior to assembling the donor substrate on the support substrate.

11. The method of claim 8, wherein removing the additional confinement region and the additional compressive stress layer comprises one of performing a selective etching of the additional confinement region and of the additional compressive stress layer, and performing an oxidation followed by an etching of the additional confinement region and of the additional compressive stress layer.

12. The method of claim 5, wherein implanting ions into the donor substrate comprises implanting at least one of hydrogen and helium ions into the donor substrate.

13. The method of claim 12, further comprising selecting the donor substrate to comprise monocrystalline silicon.

14. A structure, comprising:
a support substrate;
a donor substrate disposed on the support substrate;
an embrittlement region within the donor substrate and delimiting a first portion and a second portion of the donor substrate on opposing sides of the embrittlement region, the first portion of the donor substrate being disposed between the support substrate and the second portion of the donor substrate; and
a compressive stress layer disposed within the donor substrate and delimiting a confinement region interposed between the compressive stress layer and the embrittlement region; and
wherein the compressive stress layer is disposed in the first portion of the donor substrate and delimits the confinement region and an active region on opposing sides of the compressive stress layer.

15. The structure of claim 14, further comprising an additional compressive stress layer disposed in the donor substrate and delimiting an additional confinement region interposed between the additional compressive stress layer and the embrittlement region, the confinement region and the additional confinement region being disposed on opposing sides of the embrittlement region.

16. The structure of claim 14, wherein the compressive stress layer comprises atoms having an atomic radius greater than an atomic radius of atoms in the donor substrate.

17. The structure of claim 14, wherein the compressive stress layer is located and configured to confine the propagation of a fracture front along the embrittlement region within the confinement region.

* * * * *

UNITED STATES PATENT AND TRADEMARK OFFICE
CERTIFICATE OF CORRECTION

PATENT NO. : 9,548,237 B2  
APPLICATION NO. : 14/377738  
DATED : January 17, 2017  
INVENTOR(S) : Gweltaz Gaudin et al.

It is certified that error appears in the above-identified patent and that said Letters Patent is hereby corrected as shown below:

In the Specification
| | | | |
|---|---|---|---|
| | Column 3, | Line 39, | change "comprises step" to --comprises step f)-- |

In the Claims

| | | | |
|---|---|---|---|
| Claim 3, | Column 9, | Line 53, | change "the confinement region and the compressive" to --the additional confinement region and the additional compressive-- |
| Claim 8, | Column 10, | Lines 10-11, | change "the additional confinement region and the additional compressive" to --the confinement region and the compressive-- |

Signed and Sealed this  
Fourteenth Day of November, 2017

Joseph Matal  
*Performing the Functions and Duties of the*  
*Under Secretary of Commerce for Intellectual Property and*  
*Director of the United States Patent and Trademark Office*